(12) United States Patent
Zayets et al.

(10) Patent No.: US 7,936,631 B2
(45) Date of Patent: May 3, 2011

(54) NON-VOLATILE MEMORY ELEMENT AND METHOD OF OPERATION THEREFOR

(75) Inventors: Vadym Zayets, Ibaraki (JP); Koji Ando, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 289 days.

(21) Appl. No.: 12/318,823

(22) Filed: Jan. 9, 2009

(65) Prior Publication Data

US 2009/0175110 A1  Jul. 9, 2009

(30) Foreign Application Priority Data

Jan. 9, 2008 (JP) ................. 2008-001970

(51) Int. Cl.
*G11C 13/04* (2006.01)
(52) U.S. Cl. ........................ 365/215; 365/234
(58) Field of Classification Search .............. 365/215, 365/234, 158; 385/108, 900
See application file for complete search history.

(56) References Cited

U.S. PATENT DOCUMENTS

| | | | |
|---|---|---|---|
| 5,740,117 A | 4/1998 | Bona et al. | |
| 5,999,284 A | 12/1999 | Roberts | |
| 6,647,163 B2 | 11/2003 | Song | |
| 6,963,091 B1 * | 11/2005 | Vashchenko et al. | 257/213 |
| 7,171,096 B2 | 1/2007 | Zayets | |
| 7,254,150 B2 * | 8/2007 | Yoshida et al. | 372/43.01 |
| 2005/0117617 A1 * | 6/2005 | Yoshida et al. | 372/44 |
| 2006/0002037 A1 | 1/2006 | Zayets | |
| 2006/0096633 A1 * | 5/2006 | Chu | 136/254 |

FOREIGN PATENT DOCUMENTS

JP  2006-018964 A  1/2006

OTHER PUBLICATIONS

Shinji Yuasa et al., "Giant room-temperature magnetoresistance in single-crystal Fe/MgO/Fe magnetic tunnel junctions", Nature Materials, vol. 3, pp. 868-871 (Dec. 2004).
Hitoshi Kubota et al., "Evaluation of Spin-Transfer Switching in CoFeB/MgO/CoFeB Magnetic Tunnel Junctions", Japanese Journal of Applied Physics, vol. 44, No. 44, pp. L1237-1240 (2005).
J. C. Slonczewski, "Current-driven excitation of magnetic multilayers", Journal of Magnetism and Magnetic Materials, vol. 159, pp. L1-L7 (1996).
J. Z. Sun, "Spin-current interaction with a monodomain magnetic body: A model study", Physical Review B, vol. 62, No. 1, pp. 570-578 (Jul. 1, 2000).

* cited by examiner

*Primary Examiner* — Vu A Le
(74) *Attorney, Agent, or Firm* — Rader, Fishman & Grauer PLLC

(57) ABSTRACT

A very small magnetic tunnel junction is formed on a semiconductor p-i-n diode. Spin-polarized current which is generated by circular polarized light or elliptically-polarized light, is injected into a free layer of the magnetic tunnel junction so that magnetization direction (two opposite directions) in the free layer is changed based on the information, whereby information is stored in the memory element.

6 Claims, 7 Drawing Sheets

NON-VOLATILE MEMORY ELEMENT AND METHOD OF OPERATION THEREFOR

CROSS-REFERENCES TO RELATED APPLICATION

This application claims priority from Japanese Patent Application Serial No. 2008-001970 filed Jan. 9, 2008, the contents of which are incorporated herein by reference in its entirety.

TECHNICAL FIELD

Described herein is a high-speed optical memory element, which may form part of an optical communication system or an optical applications system.

BACKGROUND

A high-speed non-volatile optical memory is very important for an optical network. High-speed data processing such as receiving, storing and resending data is a main function of an optical network server. High-speed optical memory is required to realize such a function at high speed.

As disclosed in U.S. Pat. No. 5,740,117, a method of storing optical signals in a loop structure in order to store a fixed amount of information within an optical loop is known.

Further, as disclosed in U.S. Pat. Nos. 5,999,284 and 6,647,163, an optical memory device with a Mach-Zender interferometer which has a semiconductor optical amplifier as a component, is known. A major restriction with regards to the operational speed of such a device, results from a long inter-subband transition time of electrons in a semiconductor. In addition, such a memory is volatile, so that it is disadvantageous that data cannot be stored for a long time.

Moreover, as disclosed in U.S. Pat. No. 7,171,096, which is a patent family of Japanese Laid Open Patent No. 2006-018964, a non-volatile high-speed optical memory element is known. A main advantage of such a memory element is a very high operation speed.

FIG. 1 shows a schematic diagram illustrates an operational principal of a conventional optical memory element, which is disclosed in U.S. Pat. No. 7,171,096 (U.S. patent application Ser. No. 11/172,861) and Japanese Laid Open Patent No. 2006-018964. The memory element is made up of a semiconductor photodiode with electrode made of ferromagnetic metal.

The information data is stored according to the magnetization directions of the ferromagnetic metal electrode. The information data is recorded by circularly polarized light. When reversed voltage is applied to the photo diode, circularly polarized light excites spin polarized current in the photodiode. The spin polarized current is injected into the ferromagnetic metal electrode thereby reversing the magnetization.

As shown in FIG. 1 the memory is made up of two major components, a semiconductor region and a single-domain ferromagnetic layer.

Data is stored according to magnetization directions of the ferromagnetic metal layer.

The optical pulse excites photo electrons in the semiconductor, and the photo electrons are injected into the ferromagnetic metal layer by applying voltage. If the light is circularly polarized, or elliptically-polarized, the excited photo electrons generated in semiconductor region are spin-polarized. That means that the number of spins in an upward direction is different from that in a downward direction.

When the spin-polarized electrons are injected into the ferromagnetic metal layer, the magnetic torque is generated, which is capable of reversing the magnetization of the ferromagnetic metal (J. C. Slonczewski, Journal of Magnetism and Magnetic Materials, Vol. 159, pp. L1-L7, 1996; and J. Z. Sun, Physical Review B, Vol. 62, pp. 570-578, July 2000). Therefore, optical information data expressed by difference of polarization states can be stored as magnetization directions in the ferromagnetic layer.

In addition, in these references, a high-speed demultiplexing method is disclosed.

Both an optical pulse for data and an optical pulse for clock are simultaneously emitted on the memory. The polarization of the optical pulse for data and that for clock is linear polarization and is orthogonal to each other. Since the polarization of the synthesized optical pulse becomes circular polarization only where these optical pulses are simultaneously emitted, the information data is recorded in the memory through excitation of spin-polarized electrons.

Since other optical pulses which are not matched each other at time axis, are linearly polarized, spin-polarized current is not generated, so that data is not memorized in the memory.

In order to read out stored data, the magneto-optical effect is used. Magnetization information in the free layer is read by using Faraday effect or effect of non-reciprocal loss, by illumination of this layer by the light.

In order to reverse the magnetization of the ferromagnetic metal layer with a realistic injection current, the volume of the ferromagnetic metal layer should be relatively small.

In case where injected current is smaller than 10 mA, the thickness of ferromagnetic metal layer should be approximately 2-5 nm, and the area should be approximately 0.02 $\mu m^2$ (See Kubota et al. Japanese Journal of Applied Physics Vol. 44, pp. L1237-L1240, 2005).

Since magneto-optical effect is small when the volume of material is small, it is difficult to read out information data stored in the ferromagnetic metal layer. In such a situation, application of this memory is difficult.

SUMMARY

The structure of a memory element according to the embodiments is similar to, but different from that described above, in that in the present memory element, a magnetic tunnel junction (MTJ) is used, instead of a ferromagnetic metal layer which is made up of a single layer.

Since the magneto-resistivity of the MTJ does not depend on the size of the electrode, the information data stored in the memory can be read out at a high signal to noise ratio (S/N ratio).

For example, the magneto-resistance of a Fe—MgO—Fe magnetic tunnel junction is about 200% (see S. Yuasa et al. Nature Materials 3, pp 868-871, 2004).

Also in an embodiment, magnetization reversal is assisted by unpolarized electrical current, so that it is possible to decrease the power of an optical pulse for data required for recording, thereby giving great advantage in practical use.

Described below is a memory capable of reading and writing data at a high speed of femtosecond range or picosecond range, and also to offer a non-volatile memory capable of reading and writing data by using an electrical pulse or optical pulse.

In an embodiment, a very small magnetic tunnel junction formed on a semiconductor p-i-n diode is used. Spin-polarized current which is generated by illuminating the p-i-n diode by circular polarized light or elliptically-polarized light, is injected into a free layer of the magnetic tunnel junction so that magnetization direction in the free layer is changed (reversed) based on the information, whereby information is stored in the memory element.

One of aspects of embodiments is non-volatile memory element comprising: an n-type semiconductor region; a p-type semiconductor region; a semiconductor light detection region formed between the n-type semiconductor region and the p-type semiconductor region, wherein a size and material of the semiconductor light detection region is selected so that the number of photo-curriers in a first spin direction and that of photo-curriers in a second spin direction opposite to the first spin direction are not equal to each other, when these photo-carriers are generated by light which is not linearly polarized; a side contact region which is made of metal, and is in contact with the n-type semiconductor region; a free layer which is made of ferromagnetic metal, and is in contact with the n-type semiconductor region, wherein a size and form of the free layer is selected so that magnetization direction of the free layer can be reversed by current flowing between the n-type semiconductor region and the pin layer through the free layer; a pin layer which is made of ferromagnetic-metal and is formed above the free layer, wherein a size, form and structure of the free layer and the pin layer are selected so that a magnetic field required to change magnetization direction of the pin layer is larger than that of the free layer; and a non-conductive tunnel-barrier region formed between the free layer and the pin layer, in which a thickness and material of the non-conductive tunnel-barrier region is selected so as to transmit electrons from the pin layer to the free layer or from the free layer to the pin layer, wherein data is stored in the memory element by using a nature of taking two magnetization directions in the free layer.

Another aspect of the embodiments is that in a method of recording information data into the non-volatile memory element, the information data is recorded by reversing magnetization in the free layer by circularly polarized light, or elliptically-polarized light, comprising the following steps of: applying voltage between the side contact region and the pin layer so that current passing through the free layer is lower than critical current which causes reversal of the magnetization direction in the free layer; applying voltage between the p-type semiconductor region and the pin layer, so that a reverse bias is applied to the semiconductor light detection region; and illuminating the semiconductor light detection region by the circular-polarized light and generating spin-polarized photo-curriers, whereby the intensity of the light is adjusted so that the magnetization reversal in the free layer occurs only when spin-polarized photo-carriers are injected into this layer, and only the information data according to the circularly-polarized light is recorded into the memory element.

Another aspect of the embodiments is that in the method of recording information data into the non-volatile memory element, one data pulse from a series of data pulses is selected for recording into the memory element, comprising the following steps of: illuminating the memory element by linearly polarized optical data pulses; illuminating the memory element by a linearly polarized clock pulse, wherein a polarization direction of the light pulse for clock is perpendicular to that of the optical pulses for data, and a phase difference between the optical pulses for clock and data is adjusted to be 90 degree; adjusting timing of the optical pulse for clock so that the optical pulse for clock is combined with the one of a series of the optical pulse for data, thereby generating a circularly-polarized pulse, whereby only the circularly-polarized optical pulse is recorded in the memory element.

Still another aspect of the embodiments is that in the method of recording information data into the non-volatile memory element, a tunnel resistance between the pin layer and the free layer in case where magnetization direction in the free layer and the pin layer is parallel is different from that in case where they are antiparallel, and wherein the semiconductor light detection region provides an optical gain when positive voltage is applied to the p-type semiconductor region, and negative voltage is applied to the n-type semiconductor region.

Still more aspect of the method of optically reading information data from the non-volatile memory element, comprising the following steps of: applying positive voltage to the p-type semiconductor region; applying negative voltage to the pin layer, wherein current injected in the semiconductor light detection region in case where the magnetization direction in the free layer and that in the pin layer are parallel, is different from current injected in the semiconductor light detection region in case where the magnetization direction in the free layer and that in the pin layer are antiparallel, and voltage is adjusted so that an optical gain generated in the semiconductor light detection region becomes large; and illuminating semiconductor light detection region by a light pulse, wherein after the light pulse passes through the memory element, an output pulse intensity in case where the magnetization direction of the free layer and that of the pin layer are parallel is larger than that in case where the magnetization direction of the free layer and that of the pin layer are opposite to each other, so that the information stored in the free layer is read out according to the intensity difference of the optical pulse.

When the stored information is read out, DC voltage is impressed in the semiconductor p-i-n diode through the magnetic tunnel junction. Since there is a large difference between resistance of the magnetic tunnel junction in case where magnetization direction in the free layer and a pin layer is parallel and that in case where they are antiparallel, current flowing through the semiconductor p-i-n diode in the case where the magnetization directions in the free layer and the pin layer are parallel, is largely different from that in case where they are antiparallel.

Therefore, the optical gains corresponding thereto are very different from each other. Thus, information data stored in the memory element is read out according to intensity differences of optical pulse which passes through the memory element In the embodiments, information data is written in or read out of a memory element, and further non-volatile memory can be used in an optical communication link.

BRIEF DESCRIPTION OF DRAWINGS

Other features and advantages of the present non-volatile memory element and the present method of an operation therefor will be apparent from the ensuing description, taken in conjunction with the accompanying drawings, in which.

DETAILED DESCRIPTION

A description will now be given, referring to embodiments of the present non-volatile memory element and the present method of an operation therefor. While the claims are not limited to such embodiments, an appreciation of various aspects of the present high-speed memory device is best gained through a discussion of various examples thereof. The accompanying drawings show only one of memory elements which form the memory device.

Figure 1:
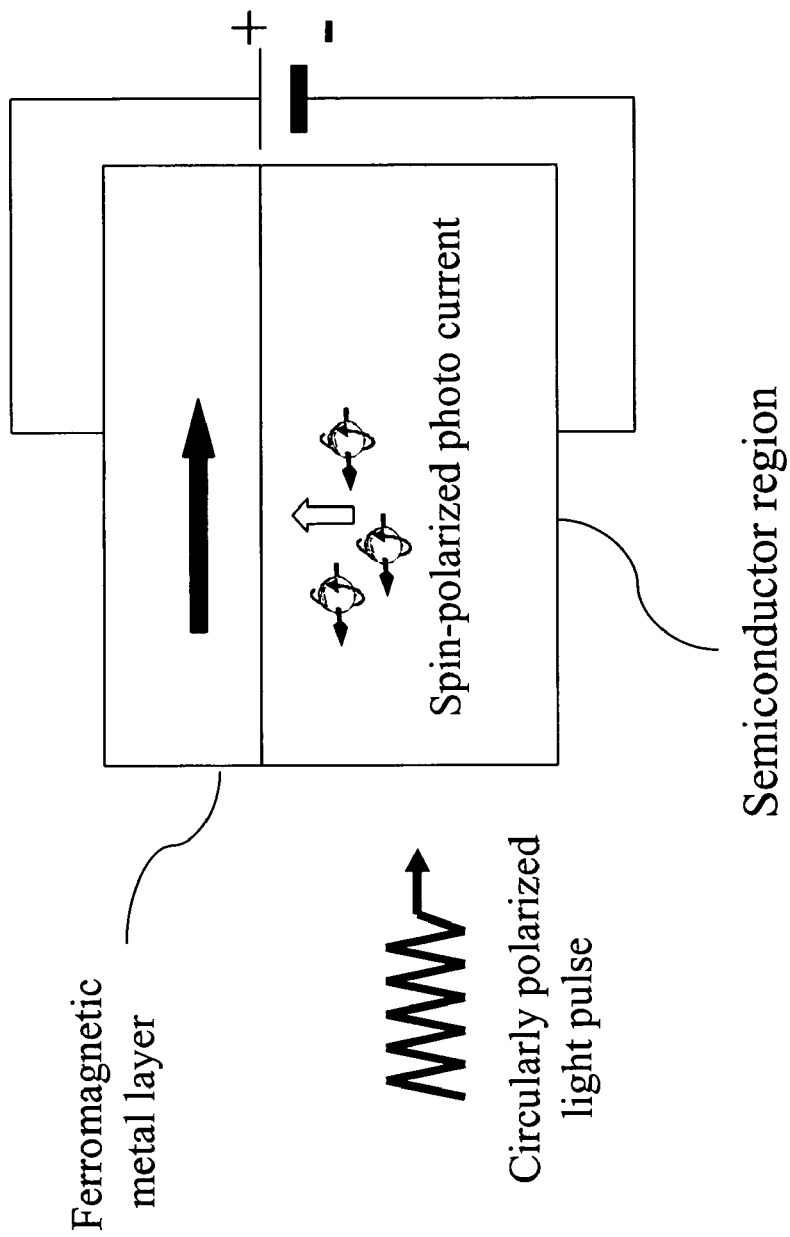
FIG. 1 is a schematic diagram illustrating the principle of an operation of a conventional optical memory element having one ferromagnetic metal layer.
Figure 2:
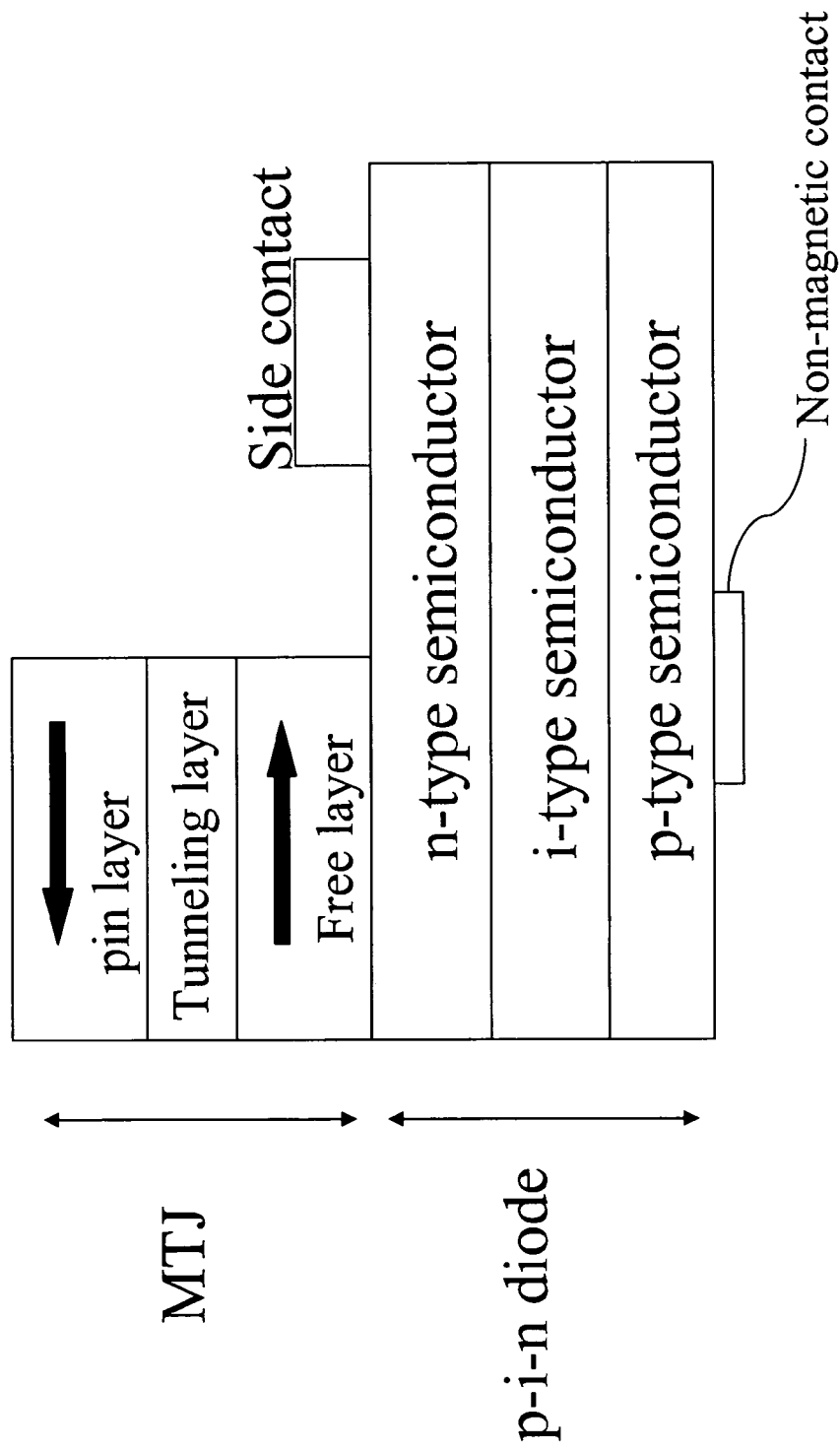
FIG. 2 is a schematic diagram of an optical memory element.

FIG. 2 shows a schematic diagram of an optical memory element according to an embodiment.

The optical memory element comprises a p-i-n diode and a magnetic tunnel junction (MTJ) electrode. The p-i-n diode consists of a p-type semiconductor region, an n-type semiconductor region, and an undoped region (an i-type semiconductor region).

The magnetic tunnel junction (MTJ) is made of two layer ferromagnetic metal regions which are separated by a non-conductive tunneling region (tunneling layer). The ferromagnetic metal region, which is in contact with the n-type semiconductor region, is referred to as a free layer. The other ferromagnetic metal region is referred to as a pin layer. The magnetic field required to change (reverse) magnetization direction of the free layer is smaller than that required for the pin layer.

The resistivity of the magnetic tunnel junction (MTJ) depends on mutual orientation of magnetization of the free and pin layers. Also, a non-magnetic electrode referred to as a side contact, which is in contact with the n-type semiconductor region, and a non-magnetic contact which is in contact with the p-type semiconductor region are provided.

Figure 3:
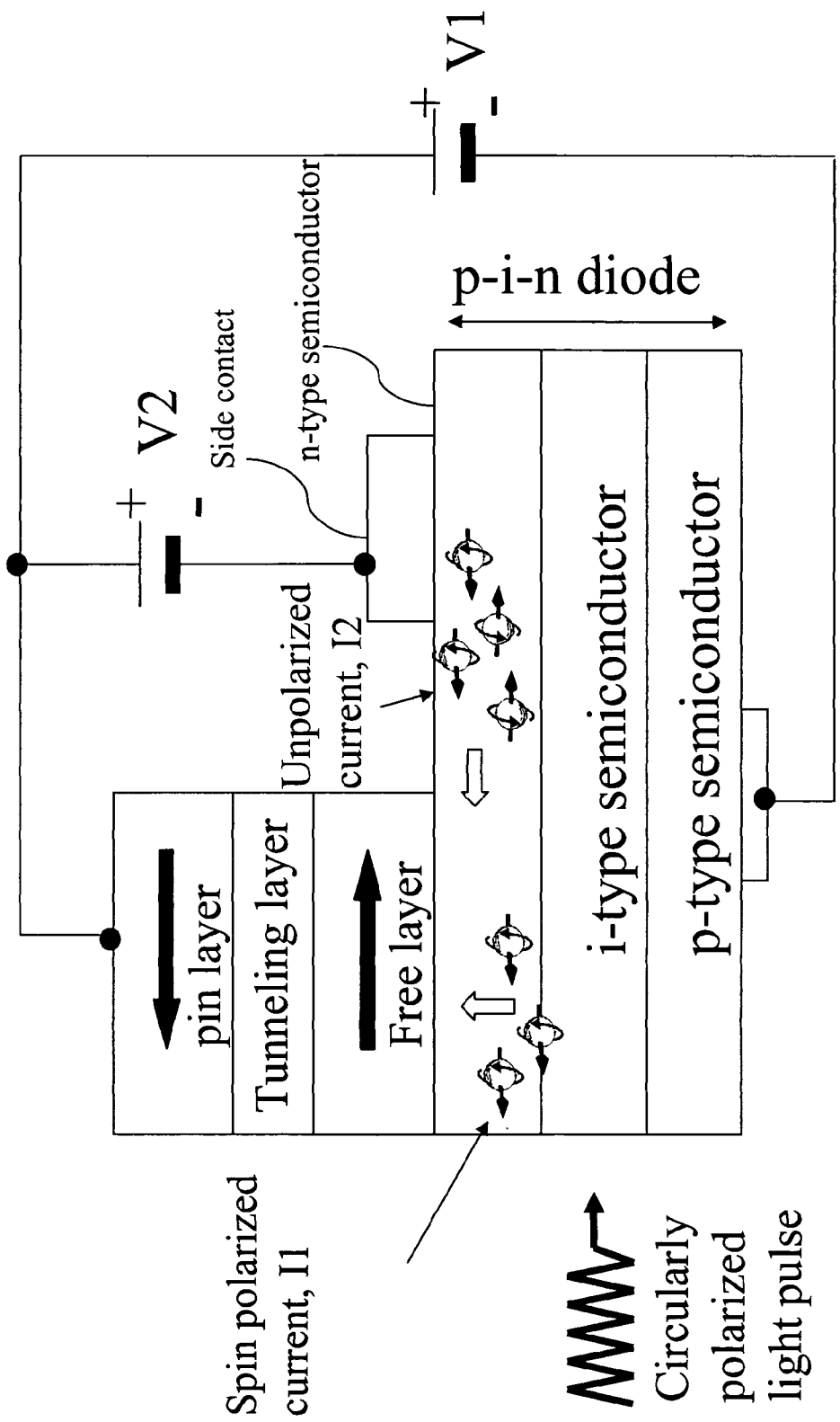
FIG. 3 is a schematic diagram illustrating a method of recording information in an optical memory element by circularly polarized optical pulse.

FIG. 3 is a schematic diagram showing a method of writing information in a memory element according to an embodiment.

By reversing the magnetization direction of the free layer by emitting circularly-polarized optical pulse on the i-type semiconductor region, data is recorded in the memory element according to the embodiment. Voltage V2 is applied between the pin layer of the magnetic tunnel junction (MTJ) and the side contact while emitting the circularly-polarized optical pulse on the i-type semiconductor region.

When electrical current I2 which flows through the magnetic tunnel junction (MTJ), exceeds the critical value, magnetization of the free layer can be reversed. However, the voltage V2 is adjusted so that the current I2 may be lower than the critical current which causes magnetization reversal. The voltage V1 is applied to the p-i-n diode through the magnetic tunnel junction (MTJ). The voltages V1 and V2 are respectively applied thereto while data recording. Since the memory is non-volatile, the voltages V1 and V2 may not be needed when date is stored. In addition, V1 may be optimized for a specific p-i-n diode, and is for example, about 5 V. The voltage V2 may be optimized for a specific the magnetic tunnel junction (MTJ), and is, for example, about 1 V.

When the p-i-n diode is not illuminated by the light, only a small amount of "dark" current flows through the p-i-n diode. When the p-i-n diode is illuminated by the light, the light excites photo electrons in the p-i-n diode. Under applied voltage V1, these electrons are injected into the free layer of the magnetic tunnel junction (MTJ).

If the light is circularly polarized, the photo induced electrons are spin polarized. That means that the number of spin-up electrons and that of spin down electrons are not equal to each other.

The intensity of the light is adjusted so that, when the light is circularly polarized, the current injected into the free layer may be large enough to cause magnetization reversal, and so that when the light is linearly polarized, the current injected into the free layer may not be enough to cause magnetization reversal.

Therefore, only the circularly polarized light can reverse magnetization of the free layer, thereby recording the information data. The unpolarized current I2 which is generated by the voltage V2 is useful to reduce the required intensity of the optical pulse for the recording.

Figure 4:
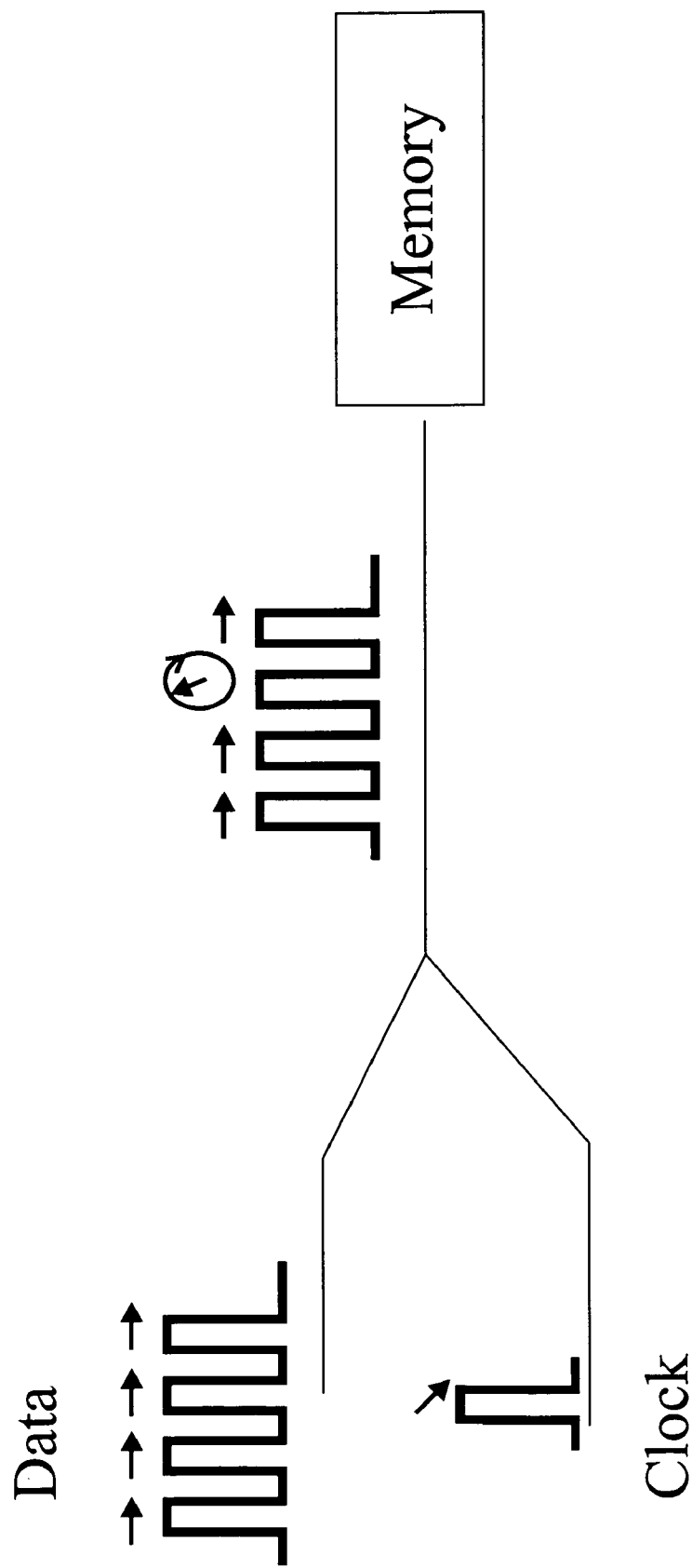
FIG. 4 shows a high-speed dimultiplexing method.

FIG. 4 shows a high-speed dimultiplexing method according to an embodiment.

A series of optical pulses for information data and an optical pulse for clock are emitted on the memory element simultaneously. The polarization of the data optical pulses and the clock optical pulse are linear and perpendicular to each other. The phase difference between the data pulses and the clock pulse is 90 degree.

Timing of the clock optical pulse is delayed (or adjusted) so that only one of the series of optical pulses for data, which is a target for recording, are combined with the clock optical pulse and are simultaneously emitted on the memory element.

Therefore, only that optical pulse for data is circularly-polarized or elliptically-polarized. The other optical pulses for data remain linearly polarized. Since data can be recorded into the memory element by only circular polarization or elliptical polarization of light, only that one optical pulse for data is stored in the memory element.

Figure 5:
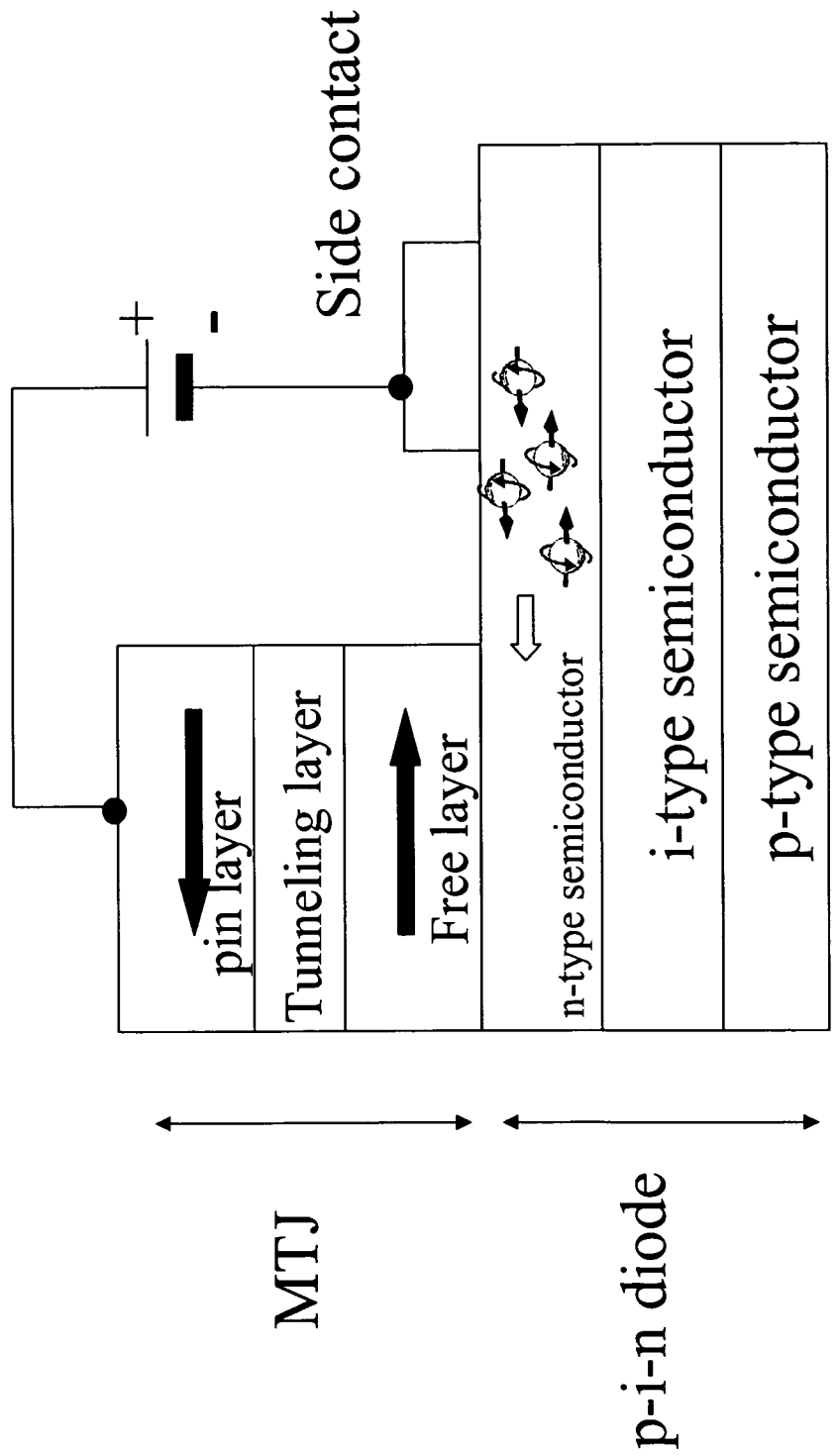
FIG. 5 is a schematic diagram illustrating a method for recording information in a memory element by applying voltage between side contact and MTJ.

FIG. 5 is a schematic diagram illustrating a recording method for the memory element according to an embodiment, in which the data of applied voltage is recoded. The magnetization direction of the free layer is reversed by applying voltage between the magnetic tunnel junction (MTJ) electrode and the side contact. In this case, the electrons flow from the side contact through an n-type semiconductor region into the free layer. If the current exceeds the critical current for magnetization reversal of the magnetic tunnel junction, the magnetization of the free layer is reversed. If the applied voltage is small, the current is not sufficient to reverse magnetization. Therefore, the data encoded into applied voltage can be recoded into the memory.

Figure 6A:
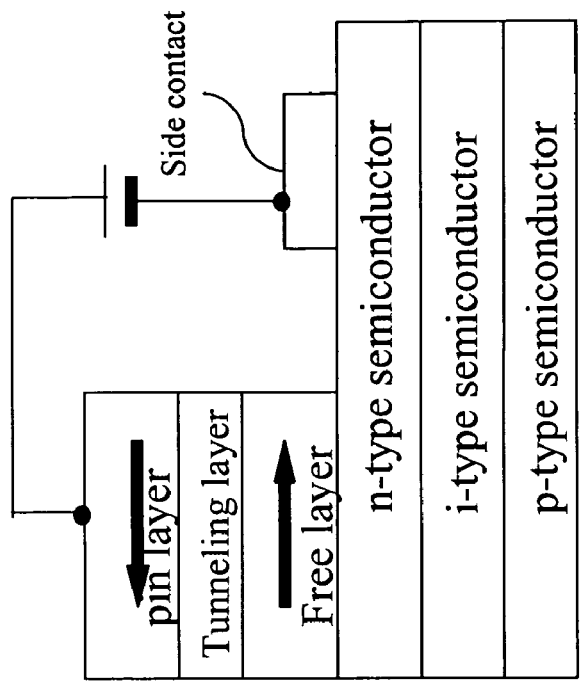
FIGS. 6A and 6B respectively show a schematic diagram illustrating a method for reading information from the memory element according by value of electrical current.
Figure 6B:
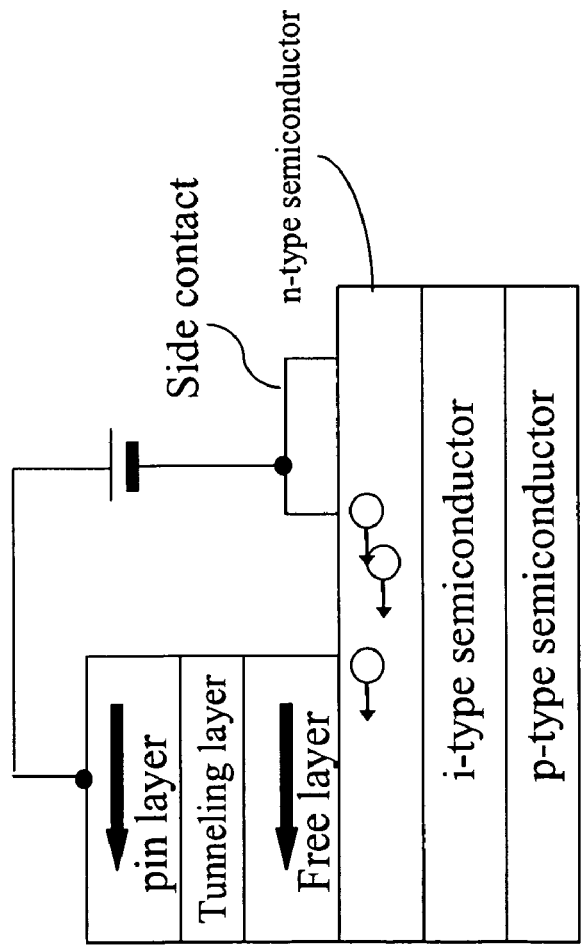

FIGS. 6A and 6B respectively shows a schematic diagram illustrating a method for reading information from the memory element according to an embodiment, in which information is read out from the memory element by measuring resistivity of the magnetic tunnel junction (MTJ) contact. When information is read from the memory element, the voltage is applied between the pin layer of the MTJ and the side contact. Because the resistivity of the MTJ is different depending on two different magnetization directions in the free layer, that is, there is small current (the magnetization is anti-parallel) when the resistivity of the MTJ is high, and there is larger current when the resistivity of the MTJ is low (the magnetization is parallel to the magnetization of the "pin" layer), the information data stored in the MTJ can be read out based on an output of, for example, a comparator (not shown) which reads the value of current flowing through the magnetic tunnel junction (MTJ).

FIG. 6A shows a case where the direction of magnetization of the free layer is the same as that of the pin layer. In this case, resistivity of the MTJ is low so there is electrical current. FIG. 6B shows a case where the direction of magnetization of the free layer is not the same as that of the pin layer. In this case, the resistivity of the MTJ is high so there is no electrical current.

Figures 7A, 7B:
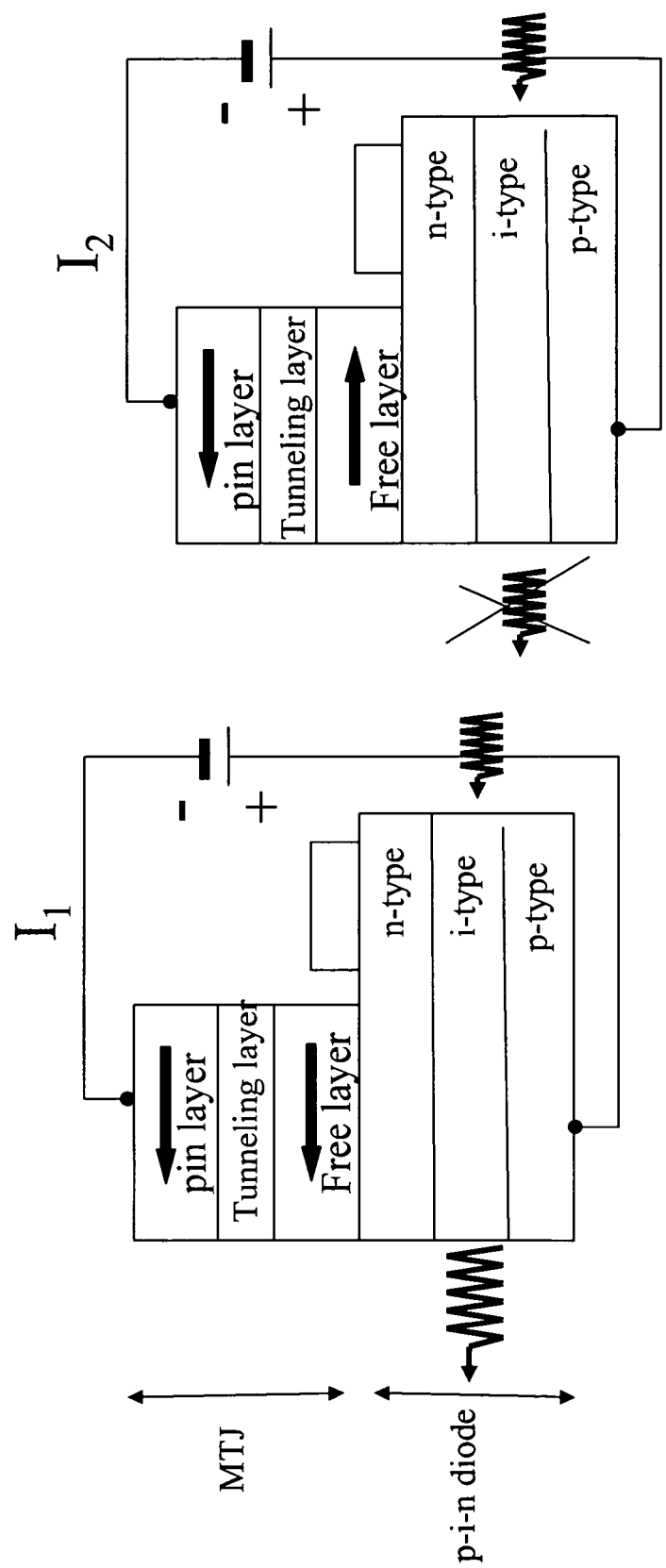
FIGS. 7A and 7B respectively show a schematic diagram illustrating a method for reading information from the memory element according to the intensity of optical pulse.

A reading method for the memory element according to an embodiment will be described, referring to FIGS. 7A and 7B a schematic diagram illustrating. FIGS. 7A and 7B show a cross sectional view of a memory element according to an embodiment, wherein the intensity of the optical pulse passing through the p-i-n diode is read.

Negative voltage is applied to a pin layer of the magnetic tunnel junction (MTJ), and positive voltage is applied to a p-type region of a p-i-n diode. Electrons from an n-type semiconductor region and holes from the p-type semiconductor region are injected into an i-type semiconductor region and are combined there. Therefore, the p-i-n diode can provide the optical gain. The value of the optical gain is proportional to the amount of carriers injected into the i-type semiconductor region.

As shown in FIG. 7A, when the applied voltage is adjusted so that when magnetizations of the free and pin layers are opposite to each other and the resistivity of the magnetic tunnel junction (MTJ) is high, the current flowing through the p-i-n diode is low so that it is not sufficient to provide enough optical gain to compensate absorption in the p-i-n diode. Therefore, in this case the optical pulse can not pass through the p-i-n diode. When directions of magnetization of the free and pin layers are the same (parallel) and the resistivity of the magnetic tunnel junction (MTJ) is low, the current flowing through the p-i-n diode is higher than that in case of FIG. 7A and it should be sufficient to provide enough optical gain to compensate absorption in the p-i-n diode. Therefore, in this case the optical pulse can pass through the p-i-n diode. Thus, for example, light which comes out of the memory element is received by a optical detector (not shown) so that information is read based on an output of the optical detector.

Since an optical gain in case where magnetization directions of the free and pin layers are opposite to each other and the resistivity of the magnetic tunnel junction (MTJ) is high, is different from that in case where the magnetization directions of the free and pin layers are the same (parallel) and the resistivity of the MTJ is low, the intensity of light passing through the p-i-n diode varies, depending on the information stored in the memory element. Thus, according to the intensity of the light passing through p-i-n diode, the information data stored in the memory element can be read by detecting the light passing through the p-i-n diode.

The preceding description has been presented only to illustrate and describe exemplary embodiments of the present non-volatile memory element and the present method of operation therefor. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A non-volatile memory element comprising:
   an n-type semiconductor region;
   a p-type semiconductor region;
   a semiconductor light detection region formed between the n-type semiconductor region and the p-type semiconductor region, wherein a size and material of the semiconductor light detection region is selected so that the number of photo-curriers in a first spin direction and that of photo-curriers in a second spin direction opposite to the first spin direction are not equal to each other, when these photo-carriers are generated by light which is not linearly polarized;
   a side contact region which is made of metal, and is in contact with the n-type semiconductor region;
   a free layer which is made of ferromagnetic metal, and is in contact with the n-type semiconductor region, wherein a size and form of the free layer is selected so that magnetization direction of the free layer can be reversed by current flowing between the n-type semiconductor region and the pin layer through the free layer;
   a pin layer which is made of ferromagnetic-metal and is formed above the free layer, wherein a size, form and structure of the free layer and the pin layer are selected so that a magnetic field required to change magnetization direction of the pin layer is larger than that of the free layer; and
   a non-conductive tunnel-barrier region formed between the free layer and the pin layer, in which a thickness and material of the non-conductive tunnel-barrier region is selected so as to transmit electrons from the pin layer to the free layer or from the free layer to the pin layer,
   wherein data is stored in the memory element by using a nature of taking two magnetization directions in the free layer.

2. A method of recording information data into the non-volatile memory element according to claim 1, wherein the information data is recorded by reversing magnetization in the free layer by circularly polarized light, or elliptically-polarized light, comprising the following steps of:
   applying voltage between the side contact region and the pin layer so that current passing through the free layer is lower than critical current which causes reversal of the magnetization direction in the free layer;
   applying voltage between the p-type semiconductor region and the pin layer, so that a reverse bias is applied to the semiconductor light detection region; and
   illuminating the semiconductor light detection region by the circular-polarized light and generating spin-polararized photo-curriers, whereby the intensity of the light is adjusted so that the magnetization reversal in the free layer occurs only when spin-polarized photo-carriers are injected into this layer, and only the information data according to the circularly-polarized light is recorded into the memory element.

3. A method of recording information data into the non-volatile memory element according to claim 1, wherein one data pulse from a series of data pulses is selected for recording into the memory element, comprising the following steps of:
   illuminating the memory element by linearly polarized optical data pulses;
   illuminating the memory element by a linearly polarized clock pulse, wherein a polarization direction of the light pulse for clock is perpendicular to that of the optical pulses for data, and a phase difference between the optical pulses for clock and data is adjusted to be 90 degree;

adjusting timing of the optical pulse for clock so that the optical pulse for clock is combined with the one of a series of the optical pulse for data, thereby generating a circularly-polarized pulse, whereby only the circularly-polarized optical pulse is recorded in the memory element.

4. The method of recording information data according to claim 2, wherein tunnel resistance between the pin layer and the free layer in case where magnetization direction in the free layer and the pin layer is parallel is different from that in case where they are antiparallel, and wherein the semiconductor light detection region provides an optical gain when positive voltage is applied to the p-type semiconductor region, and negative voltage is applied to the n-type semiconductor region.

5. A method of optically reading information data from the non-volatile memory element according to claim 1, comprising the following steps of:

applying positive voltage to the p-type semiconductor region;

applying negative voltage to the pin layer, wherein current injected in the semiconductor light detection region in case where the magnetization direction in the free layer and that in the pin layer are parallel, is different from current injected in the semiconductor light detection region in case where the magnetization direction in the free layer and that in the pin layer are antiparallel, and voltage is adjusted so that an optical gain generated in the semiconductor light detection region becomes large; and illuminating semiconductor light detection region by a light pulse, wherein after the light pulse passes through the memory element, an output pulse intensity in case where the magnetization direction of the free layer and that of the pin layer are parallel is larger than that in case where the magnetization direction of the free layer and that of the pin layer are opposite to each other, so that the information stored in the free layer is read out according to the intensity difference of the optical pulse.

6. The method of recording information data according to claim 3, wherein tunnel resistance between the pin layer and the free layer in case where magnetization direction in the free layer and the pin layer is parallel is different from that in case where they are antiparallel, and wherein the semiconductor light detection region provides an optical gain when positive voltage is applied to the p-type semiconductor region, and negative voltage is applied to the n-type semiconductor region.

* * * * *